United States Patent
Naiki et al.

(10) Patent No.: US 12,062,564 B2
(45) Date of Patent: Aug. 13, 2024

(54) OPERATING METHOD OF VACUUM PROCESSING APPARATUS

(71) Applicant: Hitachi High-Tech Corporation, Tokyo (JP)

(72) Inventors: Daichi Naiki, Tokyo (JP); Yoshiro Suemitsu, Tokyo (JP); Shinichiro Numata, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/437,274

(22) PCT Filed: Sep. 25, 2020

(86) PCT No.: PCT/JP2020/036165
§ 371 (c)(1),
(2) Date: Sep. 8, 2021

(87) PCT Pub. No.: WO2022/064623
PCT Pub. Date: Mar. 31, 2022

(65) Prior Publication Data
US 2023/0215751 A1    Jul. 6, 2023

(51) Int. Cl.
*H01L 21/677* (2006.01)
*H01L 21/67* (2006.01)

(52) U.S. Cl.
CPC .. *H01L 21/67745* (2013.01); *H01L 21/67276* (2013.01); *H01L 21/67184* (2013.01)

(58) Field of Classification Search
CPC ......... H01L 21/67184; H01L 21/67276; H01L 21/67745
See application file for complete search history.

(56) References Cited

U.S. PATENT DOCUMENTS 6,224,638 B1    5/2001   Jevtic et al.
6,293,291 B1 *  9/2001   Sperlich ............ H01L 21/67745
                                                      134/104.1
(Continued)

FOREIGN PATENT DOCUMENTS

JP    H10189687 A    7/1998
JP    2011124564 A   6/2011
(Continued)

OTHER PUBLICATIONS

English translation of JP 2016-213393, (Year: 2016).*
(Continued)

*Primary Examiner* — James Keenan
(74) *Attorney, Agent, or Firm* — Miles & Stockbridge, P.C.

(57) ABSTRACT

An operating method of a vacuum processing apparatus for processing multiple wafers sequentially in a vacuum processing apparatus comprising multiple vacuum transfer containers, adjacent two of which are interlinked, a lock chamber inside which a wafer is housed. The multiple processing units are each subjected to cleaning the interior thereof upon elapse of a predetermined period. In advance of processing multiple wafers, the operating method configures multiple sets of processing units to process each of the wafers from among the multiple processing units and starts processing of the wafers, delayed by a predetermined time in descending order of the number of processing units included in each of the multiple sets of processing units and in descending order of distance of the processing units included from the lock chamber.

6 Claims, 7 Drawing Sheets

(56) References Cited

U.S. PATENT DOCUMENTS

| | | | |
|---|---|---|---|
| 7,474,934 B2* | 1/2009 | Ji | H01L 21/67276 |
| | | | 700/121 |
| 8,906,163 B2 | 12/2014 | Huang et al. | |
| 9,805,962 B2* | 10/2017 | Ito | H01L 21/6776 |
| 11,164,766 B2* | 11/2021 | Saigou | H01L 21/67184 |
| 2010/0089423 A1* | 4/2010 | Iijima | H01J 37/32862 |
| | | | 134/22.1 |
| 2011/0110751 A1 | 5/2011 | Tauchi et al. | |
| 2013/0108400 A1 | 5/2013 | Nogi et al. | |
| 2014/0294555 A1 | 10/2014 | Kawaguchi et al. | |
| 2018/0321665 A1* | 11/2018 | Yamamoto | H01L 21/67276 |

FOREIGN PATENT DOCUMENTS

| | | | |
|---|---|---|---|
| JP | 2013080812 A | 5/2013 |
| JP | 2013098412 A | 5/2013 |
| JP | 2013207013 A | 10/2013 |
| JP | 2014195006 A | 10/2014 |
| JP | 2016213393 A | 12/2016 |

OTHER PUBLICATIONS

English translation of JP 2013-080812, (Year: 2013).*
Search Report mailed Nov. 24, 2020 in International Application No. PCT/JP2020/036165.

* cited by examiner

OPERATING METHOD OF VACUUM PROCESSING APPARATUS

TECHNICAL FIELD

The present invention pertains to a vacuum processing apparatus equipped with multiple processing units, each being provided with a vacuum container inside which a substrate-like workpiece such as a semiconductor wafer to be processed is placed and processed using plasma, and transfer units which are connected with the processing units and inside which the workpiece is transferred and particularly relates to an operation method of a vacuum processing apparatus having multiple interlinked transfer units, each being provided with a vacuum transfer container whose inside space defines a vacuum transfer chamber inside which a workpiece is transferred.

BACKGROUND ART

As one example of such vacuum processing apparatus, known is a so-called vacuum processing apparatus with interlinked chambers as noted below: vacuum transfer containers, each having a vacuum transfer chamber inside which a transfer robot is deployed to transfer a workpiece mounted on the forward ends of its arms, are connected with at least one processing unit such that a processing chamber and a transfer chamber inside both can be communicated mutually; and multiple transfer units including such vacuum transfer containers are interlinked in a front-back direction with a housing container inside which a workpiece can be housed being sandwiched therebetween.

Such vacuum processing apparatus with interlinked chambers can improve the number of wafers that can be processed per unit time (throughput) by processing workpieces in parallel by multiple processing units. However, the vacuum processing apparatus like this has a configuration in which a workpiece is transferred via at least one transfer unit to a processing unit and, if there is a significant difference between a time it takes to transfer a workpiece by each transfer unit and the start or end time of processing a workpiece in a processing unit, a wait time until a workpiece has been transferred increases and a decrease in throughput occurs. For this reason, consideration has so far been made about an operation for setting a target processing unit to which a workpiece is to be transferred and a transfer sequence without degrading throughput As an example of an operating method for the above operation according to prior art, for example, Japanese Unexamined Patent Application Publication No. 2013-98412 (Patent Literature 1) is known. In this prior art, a technical approach is described that improves throughput (the number of wafers that are processed per unit time) when multiple wafers are processed continuously in a linear tool, vacuum processing apparatus in which wafers are transferred between multiple transfer robots. Particularly, in this prior art, an approach as below is described: before start of transferring multiple wafers, the approach simulates multiple transfer algorithms for control of wafer transfer under each of conditions that combine the number of processing chambers and their locations with a wafer processing time and obtains transfer algorithm decision rules from among which the approach selects a transfer algorithm predicted to give a maximum value of throughput; and the approach calculates a wafer transfer destination according to the selected transfer algorithm, thereby providing transfer control for maximizing throughput.

Moreover, as another prior art, Japanese Unexamined Patent Application Publication No. 2014-195006 (Patent Literature 2) is known. This prior art describes a technical approach for improving throughput or efficiency of processing workpieces by comprising the following steps: a step of deciding the number of wafers, the step deciding whether the number of wafers being transferred now and existing on a transfer path is not more than a predetermined value before any given wafer is transferred from a cassette capable of housing multiple wafers inside it; a step of deciding a remaining processing time, the step deciding whether a total of a remaining processing time for a wafer scheduled to be processed and existing in a vacuum transfer container and a processing time for each of the wafers being transferred now and existing on the transfer path is not more than a predetermined value; and a step of skipping transfer, the step comprising executing the step of deciding the number of wafers and the step of deciding a remaining processing time for wafers following the any given wafer according to a transfer sequence, if conditions imposed by the step of deciding the number of wafers and the step of deciding a remaining processing time are not fulfilled and re-determining a wafer that has first fulfilled the conditions imposed by these steps as a wafer to be transferred from the cassette instead of the any given wafer.

CITATION LIST

Patent Literature

Patent Literature 1: Japanese Unexamined Patent Application Publication No. 2013-98412
Patent Literature 2: Japanese Unexamined Patent Application Publication No. 2014-195006

SUMMARY OF INVENTION

Technical Problem

The prior arts mentioned above posed a problem, because of insufficient consideration of the following points.

Specifically, in the foregoing vacuum processing apparatus with interlinked chambers, when in a manufacturing operation for producing semiconductor devices in large quantities, each of a predetermine number of multiple workpieces is transferred to each of multiple processing units and processing the workpieces is executed under the same predetermined conditions in internal processing chambers. Besides, typically, maintenance or inspection work is performed periodically for each processing unit. For example, after the last maintenance or inspection, when the cumulative number of workpieces processed in a processing chamber or a cumulative time of processing executed in a processing chamber has reached a predetermined value, a cleaning process is started as an operation for performing maintenance or inspection work, including, e.g., supplying gas to remove deposits from the surfaces of members inside a processing chamber of a target processing unit and forming plasma for a predetermined time; and depressurizing the inside space of a processing chamber down to a higher degree of vacuum than when a workpiece is processed among others.

During such an operation for maintenance or inspection, workpiece processing is not executed in a processing unit under the cleaning process and the processing unit is under a so-called non-processing operation; consequently, there is a decrease in the availability factor or throughput of the vacuum processing apparatus manufacturing semiconductor devices by workpiece processing. In the prior arts mentioned previously, it is insufficient to make consideration for eliminating a decrease in the availability factor or throughput during execution of cleaning that involves forming plasma inside each processing chamber after a workpiece processing step is complete in each processing chamber and the workpiece is removed. Due to this, there was degradation in processing efficiency.

Besides, when, in comparison with a transfer time until a next workpiece to be processed has been transferred via a transfer unit to any given processing unit, a processing time it takes to process a workpiece in the processing unit is shorter, preparation for transferring the next unprocessed workpiece to the processing unit is not complete before the workpiece processing finishes. The processed workpiece is held inside the processing chamber and waits for being carried out until the preparation is complete and the unprocessed workpiece can be carried into the processing unit; a so-called wait (standby) time occurs. In the vacuum processing apparatus equipped with multiple processing units and running parallel execution of steps of processing workpieces having an equivalent structure in these units under the same conditions, when workpieces are sequentially transferred one by one to these processing units, while a vacuum transfer robot inside a transfer unit is transferring a workpiece destined for one processing unit, a workpiece destined for any other processing unit has to be put in standby. For this reason, the wait time for which processed workpieces wait in processing chambers will increase unless a sequence of transferring workpieces is selected appropriately.

More specifically, in a case where, in comparison with the manufacturing process time it takes to process workpieces for producing semiconductor devices in large quantities, the cleaning process time it takes to clean the interior of a processing chamber for maintenance or inspection is sufficiently longer, a state when a robot inside the vacuum processing apparatus transfers workpieces to multiple processing chambers and a state when the robot does not transfer a workpiece to any processing chamber are successive. In other words, a state when transfer by a robot is not in time and throughput decreases due to a transfer operation and a state when a robot does not operate almost are successive. Due to this, there was degradation in processing efficiency and this respect was not considered in the prior arts mentioned previously.

An object of the present invention resides in providing an operation method of a vacuum processing apparatus by which an optimal transfer control to give a high throughput is implemented continuously by reducing occurrence of a transfer wait time attributed to transferring workpieces to multiple processing chambers, in order words, eliminating a decrease in throughput, when a sufficiently short process and a sufficiently long cleaning process are executed continuously in multiple processing chambers.

Solution to Problem

The foregoing object is achieved by an operation method of a vacuum processing apparatus as configured below.

Specifically, embodiments can comprise an operating method of a vacuum processing apparatus for processing multiple wafers sequentially in a vacuum processing apparatus comprising multiple vacuum transfer containers arranged in a front-to-back direction, any adjacent two of which are interlinked and have an inside space which defines a transfer chamber in which a transfer robot for transferring a wafer to be processed is deployed, a lock chamber inside which a wafer is housed, placed in front of and connected with a vacuum transfer container of the multiple transfer containers which is located most forward, and multiple processing units each of which is connected with each of the multiple transfer containers respectively and includes a vacuum processing container in which a wafer is processed. Each of the multiple processing units is subjected to a process of cleaning the interior thereof upon elapse of a predetermined period. In advance of processing the multiple wafers, the operating method configures multiple sets of processing units to process each of the wafers from among the multiple processing units and starts processing of the wafers, delayed by a predetermined time in descending order of the number of processing units included in the multiple sets of processing units and in descending order of distance of the processing units included from the lock chamber.

Advantageous Effects of Invention

A set of processing units is a combination of processing units to process wafers concurrently. Processing is scheduled to start earlier, thereby creating a state where one set of vacuum processing units is under a cleaning process, whereas another set of vacuum processing units is engaged in processing wafers intended for products. Transferring workpieces to only processing chambers included within a set can lead to a decrease in the time for which a processing chamber waits for a workpiece and makes it possible to perform earlier processing of products as many as the number of wafers that can be handled in a cleaning period than in prior art. Note that, for a set not scheduled to start processing earlier, a processing sequence is set so that the set will wait for a period corresponding to a product processing time defined in terms of a periodic number of wafers, calculated from an operating time taken for a transfer operation which is regarded as a bottleneck, and then start processing.

According to the present invention, in a vacuum processing apparatus with interlinked chambers in which multiple transfer units having a transfer robot inside a transfer chamber within a container are interlinked and at least one processing unit for processing workpieces inside a processing chamber within a vacuum container is connected with each transfer unit, parallel and efficient execution of a process of cleaning one processing unit and workpiece processing in another processing unit is feasible, thereby eliminating a decrease in processing efficiency or throughput of the vacuum processing apparatus.

DESCRIPTION OF EMBODIMENTS

Figure 1:
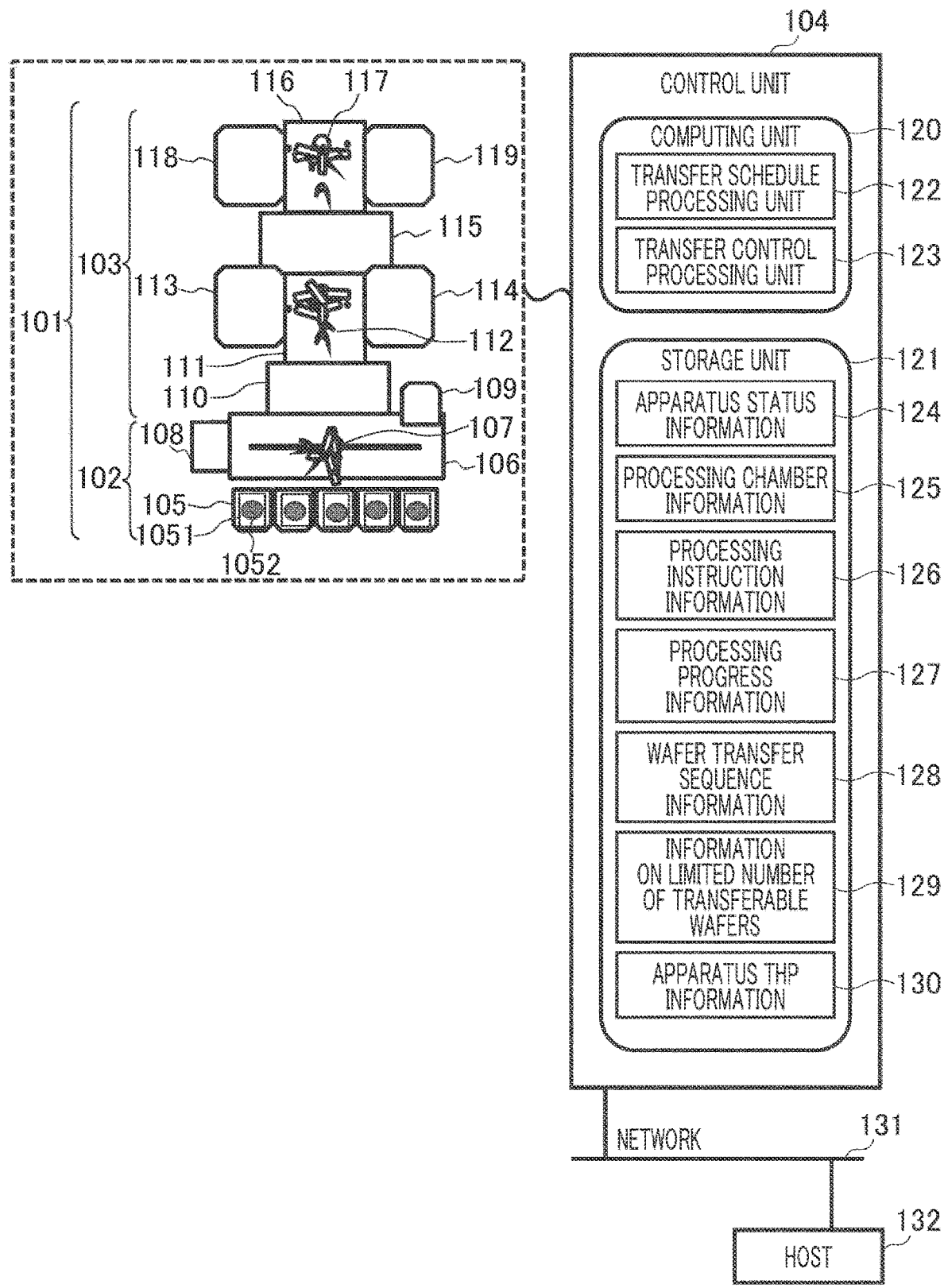
FIG. 1 is a block diagram outlining an overall configuration of a vacuum processing apparatus pertaining to an exemplary embodiment of the present invention.

For a vacuum processing apparatus equipped with multiple vacuum transfer chambers and multiple vacuum processing units, each of which is connected to each vacuum transfer chamber, the present invention is intended to set a schedule of transferring wafers between each vacuum transfer chamber and each vacuum processing unit to make it possible to achieve a high throughput, so that the vacuum processing apparatus can be operated to do so.

The invention particularly relates to an operating method of a vacuum processing apparatus. This method sets a schedule of transferring a specified number of wafers including a combination of a transfer destination (transfer path) of each wafer and a transfer sequence on the transfer path before transferring them, so that the wafers will be transferred and processed according to this schedule.

Also, the present invention resides in an operating method of a vacuum processing apparatus for processing multiple wafers sequentially using a vacuum processing apparatus in which multiple vacuum transfer containers equipped internally with a transfer robot for transferring a wafer to be processed are interlinked, the vacuum processing apparatus being equipped with multiple processing units for processing a wafer to be processed, connected with each of the interlinked vacuum transfer containers. The operating method is arranged to group the processing units connected with each of the vacuum transfer containers into multiple groups and run the groups of the processing units thus grouped at different timing or execute different processes concurrently in the groups of the processing units thus grouped.

Now, the present invention presupposes the following conditions:
(1) Each wafer is processed under equivalent (the same) processing conditions in the processing chamber of each processing unit.
(2) The interior of each processing chamber is cleaned for a longer time than a time it takes to process each wafer every time when a predetermined cumulative number of wafers have been processed (at every cumulative processing time).
(3) Vacuum transfer units (vacuum transfer chambers) with which the processing units are connected are interlinked in a front-back direction, a (load) lock chamber is connected to the front of a forward vacuum transfer unit, and, furthermore, an atmospheric transfer block (an atmospheric transfer chamber) is connected to the front of the lock chamber.

When setting a wafer transfer schedule under the conditions mentioned above, the present invention is intended to select and set one of multiple transfer schedules (combinations of transfer paths and transfer sequences) providing a higher throughput.

Furthermore, a transfer schedule mentioned above may be such that wafer transfer is to be performed with the start of transfer being delayed by a predetermined time in descending order of the number of processing units used and in descending order of distance of a processing unit from the lock chamber.

Here, the predetermined time is a time interval between successive executions of a cleaning process=a cumulative number of wafers×a time interval between the starts of processing each wafer (wafer processing cycle time)

Also, in the present invention, the operating method of the vacuum processing apparatus that sequentially transfers multiple wafers from any one of cassettes to one of multiple vacuum processing containers and processes the wafers in a predetermined processing sequence includes a step in which the vacuum processing apparatus determines a processing sequence scheduled to start processing earlier only in part of vacuum processing units (a combination of vacuum processing containers where wafers are processed concurrently) and a set of the vacuum processing containers and its processing sequence.

Processing is scheduled to start earlier, thereby creating a state where one vacuum processing unit is under a cleaning process, whereas another vacuum processing unit is engaged in processing products. In this state, transferring workpieces to only processing chambers included within a vacuum processing unit can lead to a decrease in the time for which a processing chamber waits for a workpiece and makes it possible to perform earlier processing of products as many as the number of wafers that can be handled in a cleaning period than in prior art. Note that, for a set not scheduled to start processing earlier, a processing sequence is set so that the set will wait for a period corresponding to a product processing time defined in terms of a periodic number of wafers, calculated from an operating time taken for a transfer operation which is regarded as a bottleneck, and then start processing.

In the following, an embodiment of the present invention is described in detail based on the drawings. However, the present invention should not be construed to be limited to the description of an embodiment provided below. Those skilled in the art will easily appreciate that a concrete configuration of the present invention may be modified without departing from the idea or spirit of the invention.

Exemplary Embodiment

First, the outline of a configuration of a vacuum processing apparatus 101 pertaining to an exemplary embodiment disclosed herein is described with FIG. 1. The exemplary embodiment depicted in this figure is a linear tool, vacuum processing apparatus to process workpieces such as semiconductor wafers intended for use for manufacturing semiconductor devices in processing chambers inside vacuum containers. FIG. 1 is a block diagram schematically outlining an overall configuration of the vacuum processing apparatus 101 pertaining to the exemplary embodiment of the present invention.

The vacuum processing apparatus 101 pertaining to the exemplary embodiment of the present invention, depicted in FIG. 1, is comprised of an atmospheric side block 102, a vacuum side block 103, and a control unit 104 that controls operation of these blocks.

The atmospheric side block 102 is a part for carrying wafers 1052 out from and into cassettes (hereinafter referred to as FOUPs in the present exemplary embodiment) that are capable of housing multiple wafers 1052 inside them under atmospheric pressure.

The vacuum side block 103 is a part for transferring wafers 1052 under a pressure decompressed to a predetermined degree of vacuum from atmospheric pressure and for processing wafers 1052 inside vacuum processing chambers 113, 114, 118, 119. The vacuum processing chambers 113, 114, 118, 119 execute the same process (e.g., an etching process, an asking process, a deposition process, etc.) on the wafers 1052 under the same process conditions.

The control unit 104 is a part that is connected with multiple parts of the vacuum processing apparatus 101 so as to be communicable with them; it detects status of the parts or the whole of the vacuum processing apparatus 100 and decides whether or not abnormality occurs or regulates operation of respective stations involved in transfer of wafers 1052 and processing of wafers 1052.

The atmospheric side block 102 is configured including load ports 105 in which the FOUPs 1051 capable of housing multiple wafers 1052 inside them are placed, an atmospheric side transfer robot 107 for transferring a wafer under atmospheric pressure, a rectangular atmospheric transfer container 106, an aligner 108 for adjusting orientation of and detecting a central position of a wafer 1052, and a waiting station 109 where the aligner 8 and a wafer temporarily stop and wait.

In the atmospheric side block 102, after a wafer 1052 to be processed is carried out from an FOUP 1051 by the atmospheric side transfer robot 107, the wafer 1052 passes through the aligner 108 and is carried into a load lock chamber 110 connecting to the vacuum side block 103. Besides, a wafer 1052 transferred from the vacuum side block 103 to the load lock chamber 110 is carried out therefrom and then housed into an FOUP 105.

The load lock chamber 110 is capable of being depressurized down to a predetermined vacuum pressure and pressurized up to atmospheric pressure. After carrying a wafer 1052 into the load lock chamber 110 from the atmospheric side block 102, the load lock chamber 110 is depressurized and placed in the same vacuum state as for the vacuum side block 103, so that a wafer 1052 will be carried into the vacuum side block 103. Reversely, after carrying a wafer 1052 into the load lock chamber 110 from the vacuum side block 103, the load lock chamber 110 is pressurized and its internal space is placed in an atmospheric pressure state, so that a wafer can be transferred to the atmospheric side block 102.

The vacuum side block 103 includes vacuum transfer chambers 111, 116 in which a wafer 105 is transferred inside a vacuum container, vacuum side transfer robots 112, 117 deployed inside these chambers to transfer a wafer 1052, a standby space 115 which is disposed between the multiple vacuum transfer chambers 111, 116, and the vacuum processing chambers 113, 114, 118, 119, each being provided with a vacuum container whose inside space defines a processing chamber for performing a process such as etching, asking, or deposition which is applied to wafers 1052. The vacuum processing chambers 113, 114, 118, 119 execute the same process on the wafers 1052 under the same process conditions.

Vacuum containers, each of which forms each of the multiple vacuum transfer chambers 111, 116, the vacuum processing chambers 113, 114, 118, 119, the load lock chamber 110, and the standby space 115, are interlinked via gate valves disposed therebetween, which are not depicted. These gate valves, not depicted, are opened to open communication between the interlinked spaces of both sides along with carrying in and out a wafer 1052 and closed airtight, when necessary.

The standby space 115 is sandwiched between the vacuum containers of two vacuum transfer chambers 111, 116 arranged in a front-back direction in the vacuum processing apparatus 101 and provides airtight sealing between its inside and external atmosphere exposed to atmospheric pressure; wafers 1052 placed inside another vacuum container connected with these vacuum containers are housed in this space.

Each of the vacuum side transfer robots 112, 117 deployed in the center of the vacuum transfer chambers 111, 116 which are adjacent with the standby space 115 and a gate valve intervening between them includes a vertical rotation axis disposed in the center of a vacuum container and an arm part in which both ends of multiple beam-shaped arms are connected at a joint having a vertical axis about which the arms are rotatable or swingable. As the arms of the arm part rotate about the axis of the joint, the arms extend and retract; through this arm movement, a wafer 1052 can be mounted on the forward ends of the arms and transferred.

For instance, after a vacuum side transfer robot 112 located forward in the vacuum processing apparatus 101 carries a wafer 1052 into the standby space 115, a vacuum side transfer robot 117 located backward in the vacuum processing apparatus 101 carries the wafer 1052 out from the standby space. In this way, a wafer 1052 can be transferred between the vacuum transfer chambers. In this respect, the standby space 115 is an intermediate chamber in which a wafer that is transferred between multiple vacuum transfer chambers is housed and stays in the middle. Note that the standby space 115 of the present example may be configured such that multiple containers, each of which is provided with a chamber allowing two or more wafers 1052 to be housed inside it, are stacked vertically and each container can communicate with two vacuum transfer chambers via a gate valve.

The control unit 104 controls operation of respective stations involved in transfer of wafers 1052 and processing of wafers 1052, while monitoring status of the vacuum processing apparatus 101 as a whole. Besides, the control unit 104 is configured including a computing unit 120 such as a microprocessor with semiconductor devices to determine a transfer schedule of wafers 1052 and calculate a command signal for operation of transfer of wafers 1052, a storage unit 121 to memorize and store various sorts of information, such as a hard disk or a DVD-ROM drive, and an interface unit to transmit and receive a signal to/from an external entity; these components are interconnected by a wired or wireless communication path.

The computing unit includes a transfer schedule processing unit 122 which determines a sequence in which to transfer multiple wafers 1052 installed in load ports 105 and housed in an FOUP 1051 and a transfer control processing unit 123 which controls a transfer process according to the determined sequence of transferring the wafers 1052 and controls operation of equipment such as, e.g., robots for transferring wafers 1052 and gate valves.

The storage unit 121 includes information required for computational processing as follows: apparatus status information 124, processing chamber information 125, processing instruction information 126, processing progress information 127, wafer transfer sequence information 128, information on limited number of transferable wafers 129, and apparatus THP (throughput) information 130.

Besides, the control unit 104 is connected to a host 132 via a network 131. This enables the host to issue a processing command, when necessary, to the vacuum processing apparatus 101 and monitor the apparatus status.

Each processing unit included in the computing unit 120 is described as below.

According to algorithms described in software prestored in the storage unit 121, the transfer schedule processing unit 122 acquires apparatus status information 124, processing chamber information 125, processing instruction information 126, processing progress information 127, and apparatus THP information 130 stored in the storage unit 121 via a communication means and then calculates wafer transfer sequence information 128 from these pieces of information. The calculated wafer transfer sequence is transmitted and received by the transfer control processing unit 123.

Based on wafer transfer sequence information 128 which is information determined by the transfer schedule processing unit 122 and information on limited number of transferable wafers 129 stored in the storage unit 121, the transfer control processing unit 123 calculates a command signal that requests the vacuum processing apparatus 101 to perform transfer of wafers 1052 and, thereby, controls individual operations, such as carrying a wafer 1052 in and out by a transfer robot, depressurizing and pressurizing of the load lock chamber, processing by processing modules, and opening and closing of gate valves.

Each piece of information included in storage unit 121 has information as follows.

The apparatus status information 124 includes information on, inter alia, operating status and pressure values of multiple parts of the vacuum processing apparatus 101.

As the processing chamber information 125, stored is data indicating the current state and processing status internal to a processing chamber inside the vacuum processing chambers.

These pieces of information described above will change with the ongoing operation of the vacuum processing apparatus 101 or the vacuum processing chambers 113, 114, 118, 119 and the vacuum side transfer robots 112, 117 in the vacuum transfer chambers 111, 116 are updated periodically at predetermined time intervals; they include past data as well as latest data which are discriminated and stored as apparatus status information 124 or processing chamber information 125.

For the processing instruction information 126, multiple sequence recipes are set in advance by a user before processing. A sequence recipe is comprised including a path including stations and their order through which any given wafer 1052 passes after being carried out from a FOUP 1051 in which it was housed, transferred to any of the vacuum processing chambers PU1, PU2, PU3, PU4, and processed, until it is transferred again and returned to its original location in the FOUP 1051, information on processing inside a target vacuum processing chamber, and cleaning process time and conditions. A cleaning process condition is, for example, inter alia, that cleaning should be performed after every 10 product wafers are processed. Each sequence recipe is managed and identified by number or name within the processing instruction information 126.

In the present exemplary embodiment, according to a processing command signal from the host 132, the vacuum processing apparatus 101 transfers a wafer to each vacuum processing chamber and then performs a process on the wafer in each vacuum processing chamber. In a processing command signal, a number designating a sequence recipe in the processing instruction information 126 per single or multiple wafers to be processed is included. In the present exemplary embodiment, a processing instruction (command) from the host 132 is referred to as a JOB and information contained in a signal of the JOB is referred to as JOB information. Also, the host 132 transmits a JOB signal to the control unit 104 via the network 131.

As the processing progress information 127, stored is data indicating process progress status of a JOB for which a process included as a command is ongoing in the vacuum processing apparatus 101. As an example, supposing that multiple wafers 1052, e.g., 25 wafers, are housed in a FOUP 1051 and information is acquired at predetermined time intervals, stored is information that indicates what wafer 1052 at position n in a processing sequence of wafers 1052 given in advance is carried out from the FOUP 1052 and processed at any given time and what sequence in the processing instruction information 126 for the corresponding wafer 1052 is now under execution.

As the wafer transfer sequence information 128, stored is information indicating a sequence in which each of multiple wafers 1052 housed in a FOUP 1051 is transferred. As this information, stored is information including a number identifying the position of each wafer 1052 in transfer order, a number identifying a slot of the FOUP 1051 that each wafer 1052 is located in, a number indexing one of the vacuum processing chambers 113, 114, 118, 119 in which each wafer 1052 is processed, and an event setting to enable transfer of each wafer 1052. An event is termination of a process in a processing chamber, elapse of a specified wait time, or others. The vacuum processing apparatus 101 starts transfer of wafers 1052 according to a transfer sequence, staring with a transferable wafer 1052.

The information on limited number of transferable wafers 129 is information for limiting the number of wafers 1052 being processed now in vacuum processing chambers in any given processing unit and the number of wafers 1052 being transferred now to a certain number or less in the vacuum processing apparatus 101 in which a processing command included in JOB information is under execution. This information is intended to avoid a situation where a station within the vacuum processing apparatus 101 is overfilled with wafers 1052 during simultaneous transfer of a lot of wafers 1052 and it becomes impossible to transfer wafers 1052 for a certain period of time. In the present exemplary embodiment, using the information on limited number of transferable wafers 129, a decision is made as to whether or not to allow wafers 1052 staying in a FOUP 1052 to be carried out from there.

Note that, if a station within the vacuum processing apparatus 101 is overfilled with wafers, when a cleaning process without wafers takes place, such a case may occur that the need to produce a state that is free of wafers 1052 inside a target vacuum processing chamber to be cleaned may cause a deadlock state. Therefore, a condition is provided that limits the number of transferable wafers for cleaning without wafers is provided. According to the condition, a decision is made as to whether or not to allow wafers 1052 staying in a FOUP 1052 to be carried out from there.

As the apparatus THP information 130, pre-recorded is information on throughput (THP) of the apparatus in respect to combinations of the respective vacuum processing chambers in the vacuum processing apparatus 101 and a time it takes to process a wafer 1052 inside a processing chamber. Also, the apparatus THP information 130 has a reference value that causes the apparatus to suffer from a transfer delay in respect to combinations of the respective vacuum processing chambers in the vacuum processing apparatus 101 and a time it takes to process a wafer 1052 inside each vacuum processing chamber.

The transfer delay is a state in which, when the time taken for a process executed on a wafer 1052 is sufficiently short in any of the vacuum processing chambers 113, 114, 118, 119, transfer of a next wafer 1052 to the vacuum processing chamber is not in time. For instance, if two vacuum processing chambers 113 and 114 are used, a reference value causing the transfer delay is 40 s. Such a value is calculated based on operating time of various sorts of equipment of the vacuum processing apparatus 101 and can be calculated or simulated when specifications of the apparatus have been known.

The configuration of the vacuum processing apparatus 101 is not limited to that depicted in FIG. 1. The load ports 105 may be less or more than five. Also, no limitation is intended to the vacuum processing apparatus 101 including four vacuum processing chambers 113, 114, 118, 119 in the vacuum side block 103; these chambers may be less or more than four. Furthermore, no limitation is intended to the apparatus in which two vacuum processing chambers are connected with each of the vacuum transfer chambers 111, 116; these chambers may be less or more than two. Note that, in the present exemplary embodiment, the vacuum processing chambers 113, 114, 118, 119 having a processing chamber for performing a process such as etching, asking, or deposition which is applied to wafers 1052 are referred to as PU1, PU2, PU3, PU4, respectively for convenience.

Figure 2:
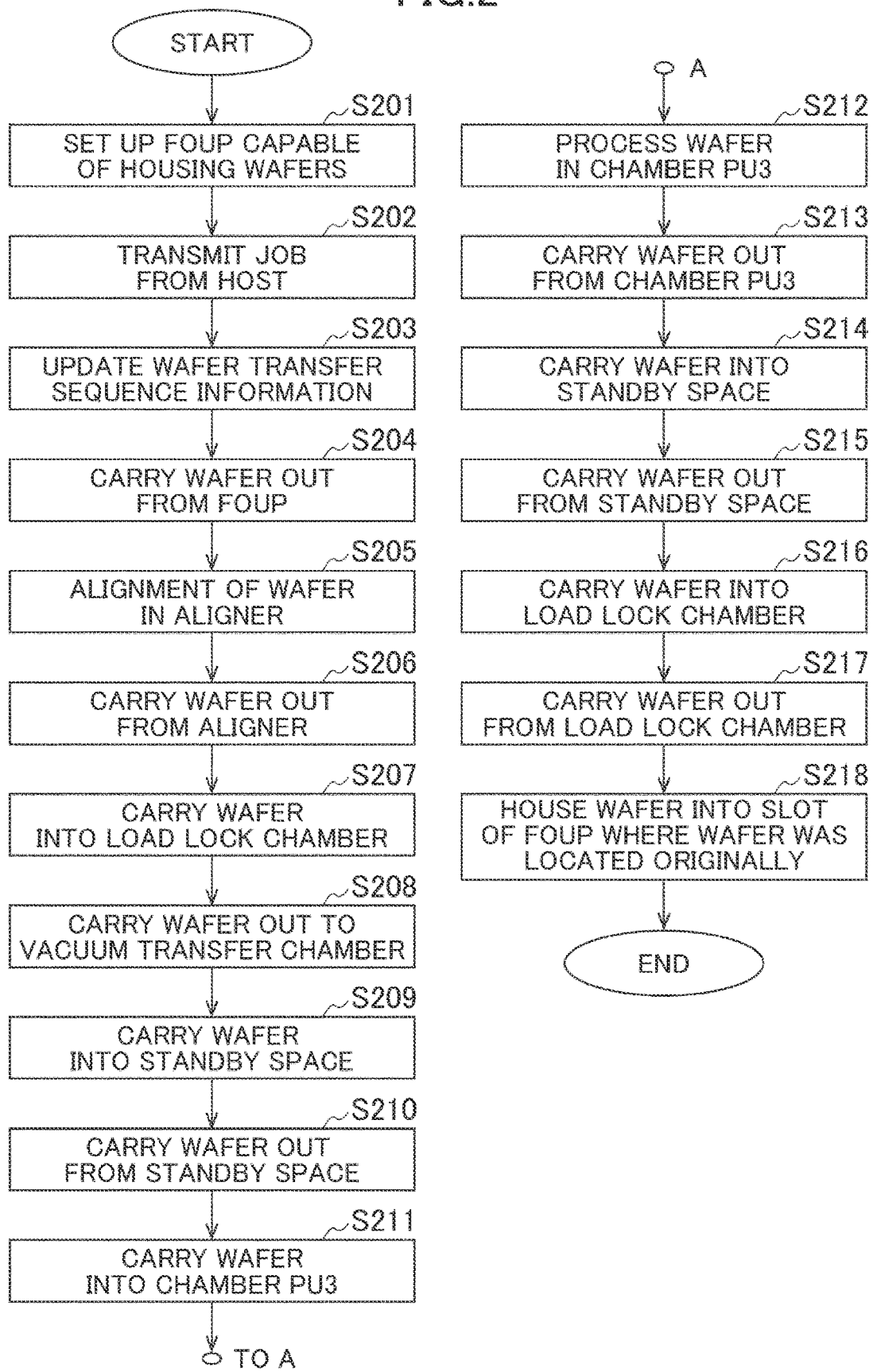
FIG. 2 is a flowchart illustrating a flow of wafer transfer when one wafer is processed in the vacuum processing apparatus pertaining to the exemplary embodiment of the present invention.

Here, a flow of a series of transfer related operations in the vacuum processing apparatus 101 is described below. Assuming that a vacuum processing chamber PU3 performs a process on a wafer, a description is provided below about a series of transfer related operations to move one wafer 1052 to/from the chamber PU3 in the vacuum processing apparatus 101, enumerating the operations in order using FIG. 2, while referring to FIG. 1. Theses transfer related operations in the vacuum processing apparatus 101 are controlled by the transfer control processing unit 123 in the computing unit 120.

First, any given FOUP 1051 capable of housing multiple wafers 1052 placed in load ports 105 is set up (S201).

Then, any given JOB is transmitted from the host 132 to the vacuum processing apparatus 101 or its control unit 104 via the network 131 (S202).

Then, wafer transfer sequence information 128 is updated by the transfer schedule processing unit 122 (S203).

Then, a wafer 1052 is carried out from the FOUP 1052 by the atmospheric side transfer robot 107 according to the wafer transfer sequence information 128 and information on limited number of transferable wafers 129 (S204).

Then, the wafer 1052 carried out by the atmospheric side transfer robot 107 is carried into the aligner 108 and alignment of the wafer 1052 is performed (S205).

Then, the wafer 1052, after its alignment is complete, is carried out by the atmospheric side transfer robot 107 (S206).

Then, after pressurizing the inside space of the load lock chamber 110 up to an atmospheric pressure state, a gate valve, not depicted, connecting the atmospheric transfer container 106 with the load lock chamber 110 opens and the atmospheric side transfer robot 107 carries the wafer 1052 into the load lock chamber (S207). After that, the gate valve closes.

Then, after the inside space of the load lock chamber 110 is depressurized from the atmospheric pressure state down to a predetermined degree of vacuum, a gate valve, not depicted, connecting the load lock chamber 110 with the vacuum transfer chamber 111 opens and the vacuum side transfer robot 112 carries the wafer 105 out from the load lock chamber 110 (S208). After that, the gate valve closes.

Then, the vacuum side transfer robot 112 holding the wafer 1052 turns toward the standby space 115 and then carries the wafer 1052 into the standby space 115 (S209).

Then, the vacuum side transfer robot 117 located backward in the vacuum processing apparatus 101 carries the wafer 1052 out from the standby space 115 (S210).

Then, the vacuum side transfer robot 117 holding the wafer 1052 turns toward the chamber PU3, then a gate valve, not depicted, of the chamber PU3 opens, and the robot carries the wafer 1052 into the chamber PU3 (S211). After that, the gate valve closes.

Then, a process on the wafer 1052 is performed inside the chamber PU3 (S212).

Then, upon completion of the process inside the chamber PU 3, a gate valve, not depicted, of the chamber PU3 opens and the vacuum side transfer robot 117 carries the wafer 1052 out from the chamber PU3 (S213). After that, the gate valve closes.

Then, the vacuum side transfer robot 117 holding the wafer 1052 turns toward the standby space 115 and then carries the wafer 1052 into the standby space 115 (S214).

Then, the vacuum side transfer robot 112 located forward in the vacuum processing apparatus 101 carries the wafer 1052 out from the standby space 115 (S215).

Then, the vacuum side transfer robot 112 holding the wafer 1052 turns toward the load lock chamber 110, then a gate valve, not depicted, connecting the load lock chamber 110 with the vacuum transfer chamber 111 opens, and the robot carries the wafer 1052 into the chamber (S216). After that, the gate valve closes.

Then, after the inside space of the load lock chamber 110 is pressurized up to the atmospheric pressure state, a gate valve, not depicted, connecting the atmospheric transfer container 106 with the load lock chamber 110 opens and the atmospheric side transfer robot 107 carries the wafer 105 out from the load lock chamber 110 (S217). After that, the gate valve closes.

Finally, the atmospheric side transfer robot 107 houses the wafer 1052 into a slot of the FOUP 1051 where the wafer was located originally and carried out (S218).

In the series of transfer related operations described here, if a vacuum processing chamber PU4 performs a process on a wafer, the vacuum processing chamber into which the vacuum side transfer robot 117 carries the wafer only changes to the chamber PU4, but other steps in the series of transfer related operations are the same as described above. Also, if a vacuum processing chamber PU1 or PU2 performs a process on a wafer, when the wafer has been transferred to the vacuum side transfer robot 112, transfer related operations are performed to transfer the wafer to the target vacuum processing chamber PU1 or PU2 and no significant change is made to the flow of the transfer related operations. Besides, although the foregoing transfer related operations are performed for a single wafer 1052, the present vacuum processing apparatus 101 is capable of handling multiple wafers concurrently. The foregoing transfer related operations are performed for each of the multiple wafers 1052. Also, it is also possible to perform the foregoing transfer related operations intended for use of multiple FOUPs 1052.

Figure 3:
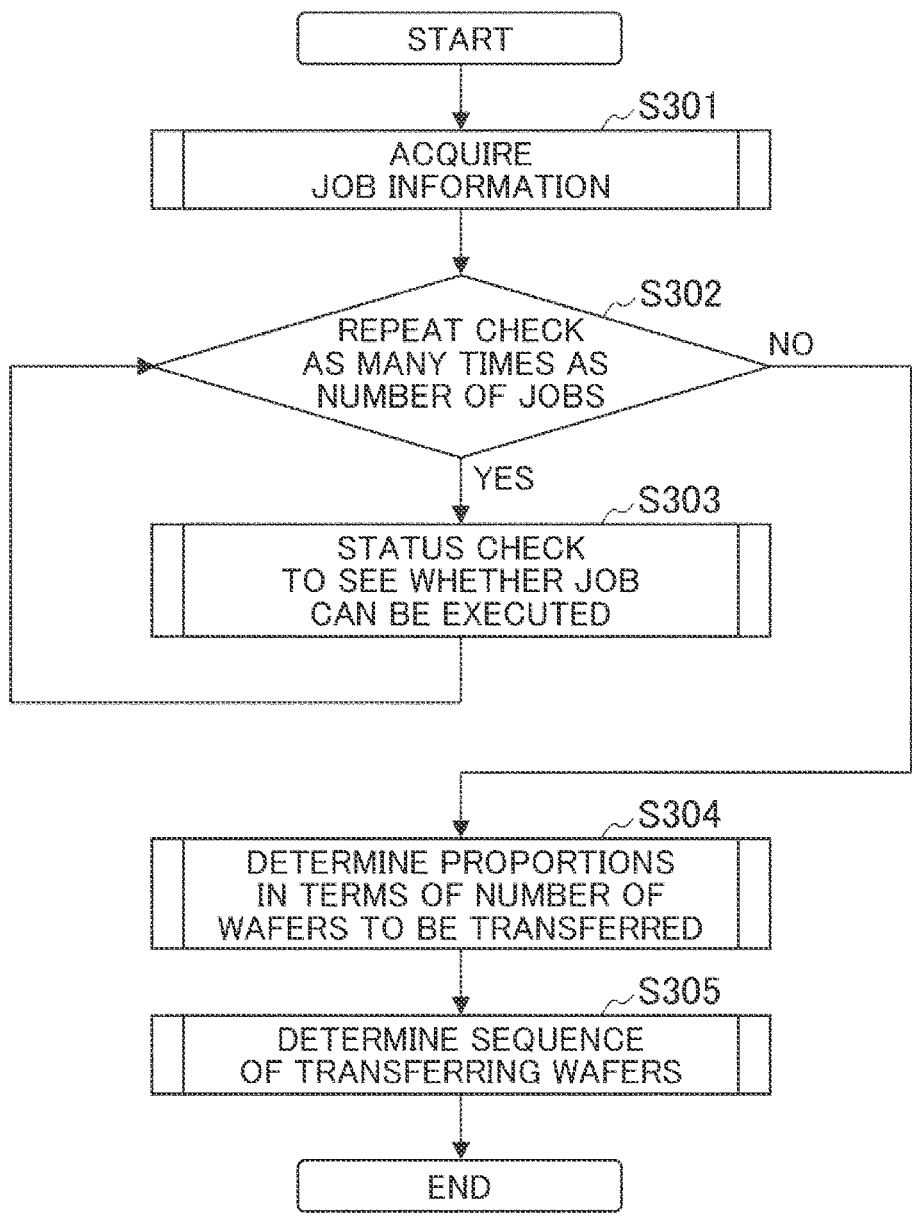
FIG. 3 is a flowchart illustrating a flow of processing which is performed by a transfer schedule processing unit of the vacuum processing apparatus pertaining to the exemplary embodiment of the present invention.
Figure 4:
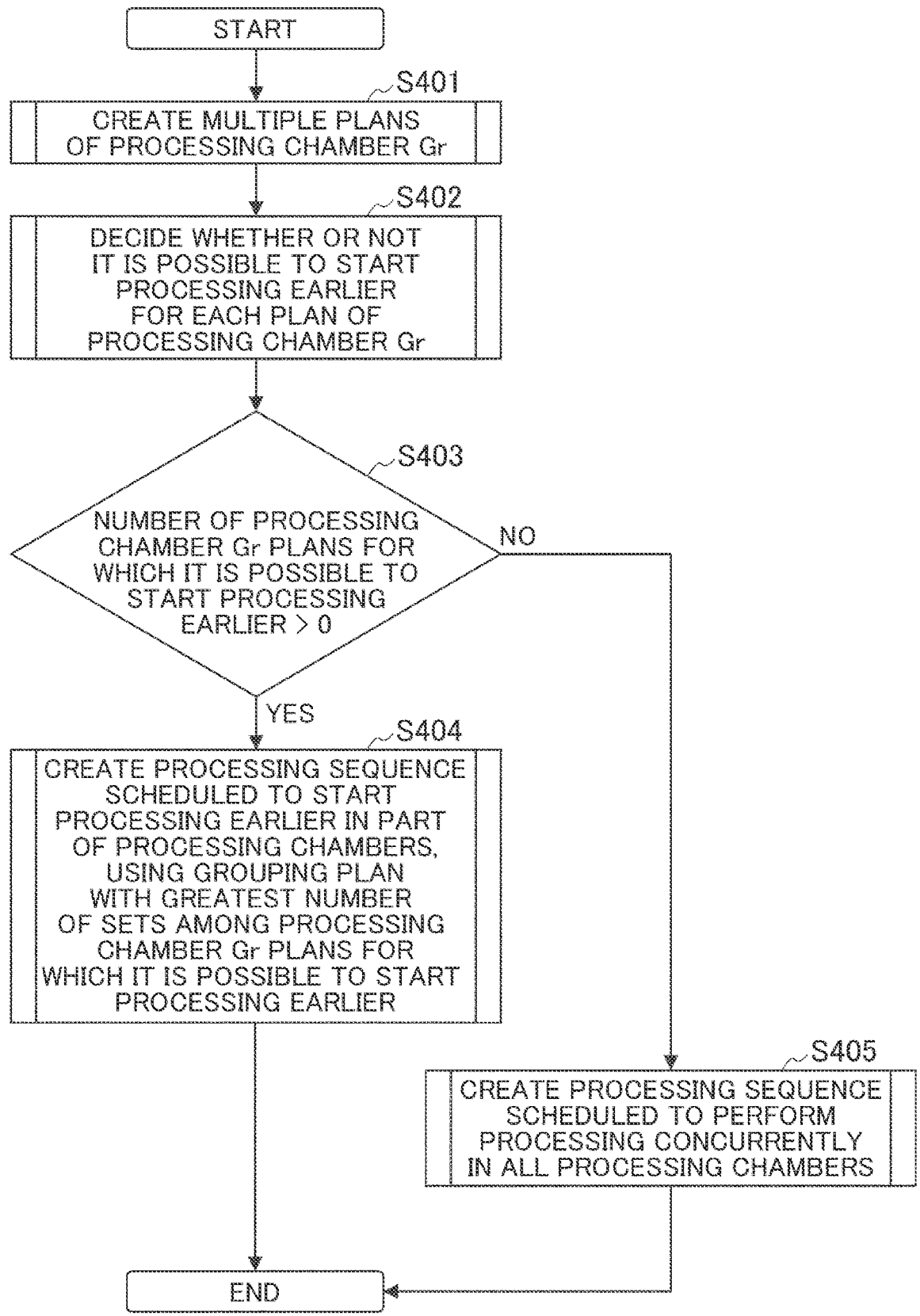
FIG. 4 is a flowchart illustrating a flow of a procedure in which a sequence of transferring wafers is determined, as illustrated at step S305 in FIG. 3.
Figure 5:
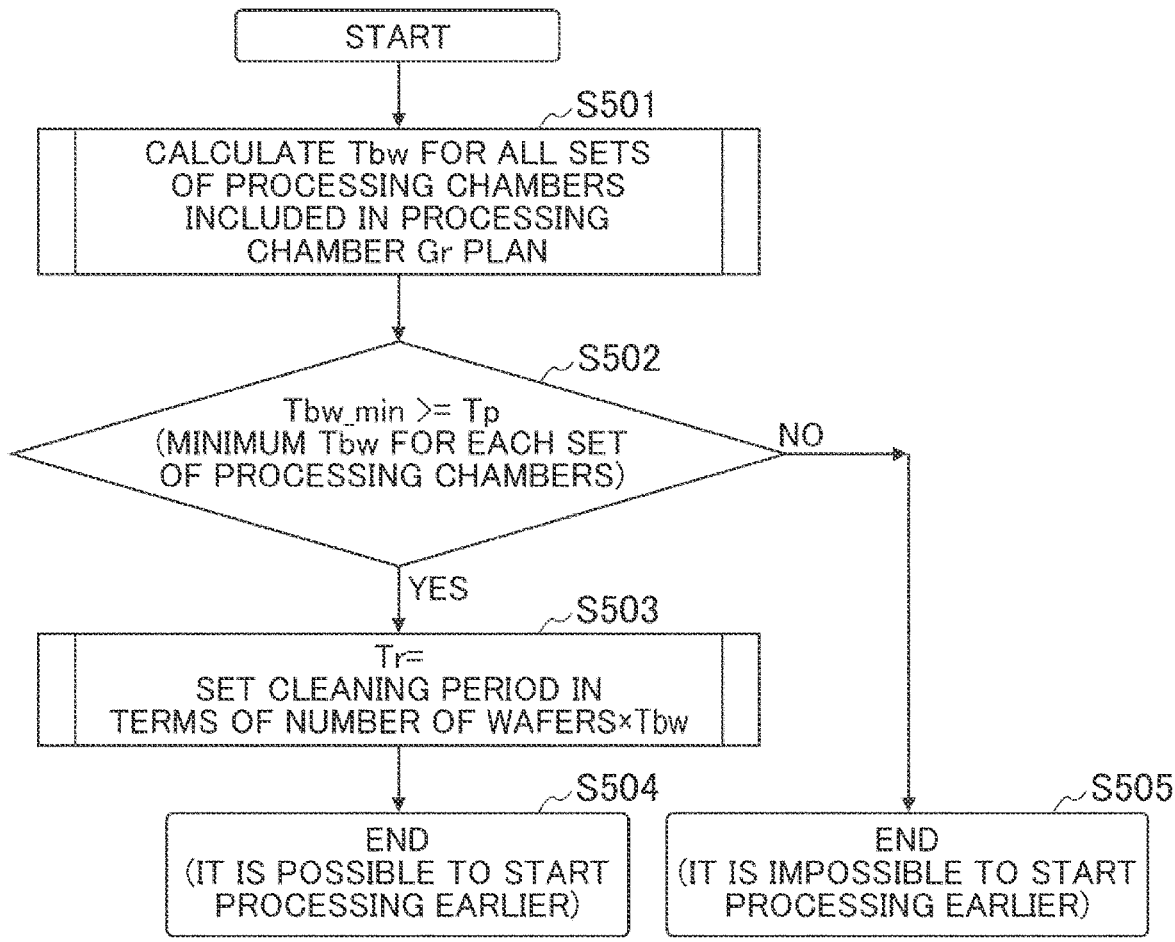
FIG. 5 is a flowchart illustrating a flow of an operation of deciding whether or not it is possible to start processing earlier for each plan of processing chamber Gr in step S402 illustrated in FIG. 4.

Then, with regard to wafer transfer sequence information which is updated at S203, a description is provided about how the computing unit 120 determines wafer transfer sequence information 128, i.e., a flow of the transfer schedule processing unit, using FIG. 3, FIG. 4, and FIG. 5.

The computing unit 120 periodically executes processing by the schedule processing unit 122 using an interrupt time provided within it. Alternatively, the computing unit 120 executes processing by the schedule processing unit 122 in an event-driven manner, for example, in response to an instruction from the host 132, status of the vacuum processing apparatus 101, or others.

FIG. 3 is a flowchart illustrating a flow of processing which is performed by the transfer schedule processing unit 122 of the vacuum processing apparatus 101 pertaining to the exemplary embodiment depicted in FIG. 1. This figure outlines processing by the transfer schedule processing unit 122 and operations based on the flowchart are as described below.

At step S301, first, the computing unit 120 in the control unit 104 checks whether or not a new JOB transmitted from the host 132 via the network is present, using the interface unit or the storage unit 121 and, when such JOB has been detected to be present, acquires JOB information included in the JOB. The transfer schedule processing unit 122 retains JOB information in a temporary buffer of the computing unit 120.

At step S302, then, the computing unit 120 performs a status check to see whether a JOB can be executed repeatedly as many times as the number of pieces of JOB information retained in the temporary buffer of the computing unit 120. Specifically, the computing unit 120 checks to see whether the vacuum processing apparatus 101 can transfer wafers relevant to a process described in the JOB information from the apparatus status information 124, processing chamber information 125, processing instruction information 126, and processing progress information 127 in the storage unit 121.

Note that, in the present example, the vacuum processing apparatus 101 can execute operations related to multiple JOBs in parallel, if possible. Besides, when multiple JOBs have been detected, the apparatus may execute the multiple JOBs to be executed in parallel according to order that is set according to a predetermined evaluation criterion which is, e.g., inter alia, giving priority to a JOB requested earlier from the host 132.

Upon completing the repetitive step S302, the computing unit 120 decides whether or not there is a new JOB to be executed; if deciding that there is no new job, it terminates the transfer schedule processing unit 122.

When a new JOB to be executed is selected, the computing unit 120 updates the wafer transfer sequence information 128 including wafers allocated to the new JOB to be executed at step S304 and step S305. Specifically, at step S304, the computing unit 120 calculates and determines proportions in terms of the number of wafers to be transferred to the respective vacuum processing chambers 113, 114, 118, 119 from sequence recipe information relevant to a process included in the JOB information and the JOB.

Furthermore, at step S305, the computing unit 120 determines a sequence of wafers to be transferred to each of the vacuum processing chambers 113, 114, 118, 119 from the JOB information of the JOB to be executed, the sequence recipe information, and the proportions in terms of the number of wafers calculated at step S304 and then updates the wafer transfer sequence information 128.

A detailed description is provided about the step S305 in FIG. 3, i.e., a procedure for determining a sequence of transferring wafers 1052, using FIG. 4.

FIG. 4 is a flowchart illustrating a flow of the procedure in which a sequence of transferring wafers 1052 is determined, as illustrated at step S305 in FIG. 3. Sequence of transferring wafers 1052 in the vacuum processing apparatus 101 is scheduled in two ways: a processing sequence scheduled to start processing earlier in part of the vacuum processing chambers or a processing sequence scheduled to perform processing concurrently in all the vacuum processing chambers, as in prior art.

Besides, within the above two ways of processing sequence, the procedure determines a sequence in which each wafer 1052 is actually transferred from a FOUP 1051, using information of the proportions in terms of the number of wafers calculated at step S304. A sequence of transferring wafers 1052 is determined at step S404 or step S405. Operations based on the flowchart of FIG. 4 are as described below.

At step S401, first, the computing unit 120 creates one or more plans of vacuum processing chamber grouping (hereinafter mentioned as vacuum processing chamber Gr) from JOB information included in a signal of a JOB to be executed and sequence recipe information. Here, a group of vacuum processing chamber Gr consists of a single vacuum processing chamber or a set of multiple vacuum processing chambers. A set of vacuum processing chambers is a single vacuum processing chamber or a combination of multiple vacuum processing chambers in which processing takes place concurrently; e.g., (PU1), (PU1 and PU2), etc.

Vacuum processing chamber Gr just enough contains vacuum processing chambers that a JOB to be executed uses. For example, if a JOB uses PU1, PU2, PU3, and PU4, grouping is {(PU1 and PU2) and (PU3 and PU4)} among others. In the present exemplary embodiment, taking maintainability of vacuum processing chambers into consideration, a set of vacuum processing chambers consists of vacuum processing chambers to which the same vacuum side transfer robot can transfer wafers 1052.

At step S402, then, the computing unit 120 decides whether it is possible to start processing earlier in some set of vacuum processing chambers for each of vacuum processing chamber Gr plans created at step S401.

After making the decision for all the vacuum processing chamber Gr plans, checking is made at step S403 to see whether there are one or more Gr plans for which it is possible to start processing earlier. If there is at least one Gr plan for which it is possible to start processing earlier (if decided Yes at step S403), the flowchart determines to adopt a vacuum processing chamber GR at step S404. If there is no Gr plan for which it is possible to start processing earlier (if decided No at step S403), the flowchart creates a processing sequence scheduled to start processing concurrently in all the vacuum processing chambers using prior art at step S405.

If the decision at step S403 is that multiple Gr plans mentioned above allow part of the vacuum processing chambers to start processing earlier (if decided Yes at step S403), the flowchart determines to adopt any of the Gr plans by making a comparison between each of these Gr plans at step S404. In the present exemplary embodiment, a condition of the determination is a group consisting of the greatest number of sets of vacuum processing chambers for the purpose of shortening the time for which a vacuum processing chamber waits in as many sets of vacuum processing chambers as possible.

Finally, the wafer transfer sequence information 128 is updated after the determination of a processing sequence scheduled to start processing earlier in part of the vacuum processing chambers at step S404. Specifically, a wait time (n−1)×Tr is set for an event that triggers the start of transferring wafers 1052 sequentially to the processing chambers, starting with a processing set including the greatest number of processing chambers, followed by a set of processing chambers including processing chambers that are far from the load lock chamber 110. Here, n is a position in processing set starting sequence, starting with 1. Tr represents a time it takes to process product wafers for a set cleaning period in terms of the number of wafers, which will be described later. Here, the event that triggers the start of transferring wafers 1052 is, for example, termination of a process in a processing chamber, elapse of a specified wait time, or others.

Note that, in the present exemplary embodiment, processing chambers that are far from the load lock chamber 110 refer to processing chambers in linkage with a vacuum side transfer robot located in the back, when viewed from the load lock chamber 110. Also, in the present exemplary embodiment, a cleaning process without using wafers 1052 is performed at the start of a JOB. Here, the start of processing in each processing chamber is the start of the above cleaning process.

When cleaning is not performed at the start of a JOB or a cleaning process using wafers 1052 is performed, the start of processing in each processing chamber is carrying the first wafer 1052 to be transferred to a processing chamber out from the FOUP 1051.

Using FIG. 5, a description is provided about the step S402 in FIG. 4, i.e., a procedure for deciding whether or not it is possible to start processing earlier in some set of vacuum processing chambers. FIG. 5 is a flowchart illustrating a flow of an operation of deciding whether or not it is possible to start processing earlier for each plan of processing chamber Gr in the step S402 illustrated in FIG. 4. Operations based on the flowchart of FIG. 5 are as described below.

At step S501, first, the computing unit 120 calculates a time interval of carrying a wafer into a processing chamber (equivalent to Tbw 707 in FIG. 7A or Tbw 717 in FIG. 7B) in each set of vacuum processing chambers included in a vacuum processing chamber Gr. Tbw 707 or Tbw 717 is calculated from a bottleneck portion of the vacuum processing apparatus or calculated based on THP information of the apparatus pre-recorded in the apparatus THP information 130.

At step S502, then, checking is made to see whether a transfer delay occurs during individual process execution in all sets of processing chambers. Specifically, a decision is made as to whether the minimum Tbw 707 or Tbw 717 of the time interval of carrying a wafer into a processing chamber, Tbw 707 or Tbw 717, calculated for each set of processing chambers, is greater than a product processing time (Tp) set for the JOB. If the minimum Tbw is smaller than Tp (if decided No at S502), a decision is made that it is impossible to start processing earlier. If the minimum Tbw is greater than Tp (if decided Yes at S502), the flowchart proceeds to step S503 that calculates a time Tr it takes to process product wafers for a set cleaning period in terms of the number of wafers by multiplying the period in terms of the number of wafers by the carry-in time interval (Tbw 707 or Tbw 717) and a decision is made that it is possible to start processing earlier (S504).

Figure 6A:
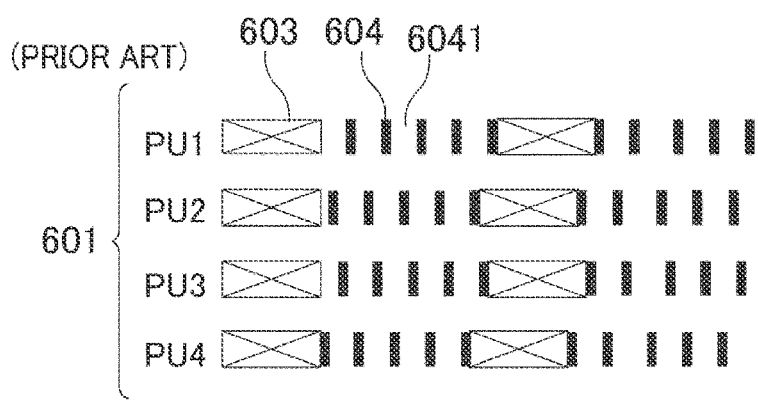
FIG. 6A is a time chart schematically illustrating a flow of operation of processing wafers according to prior art.
Figure 6B:
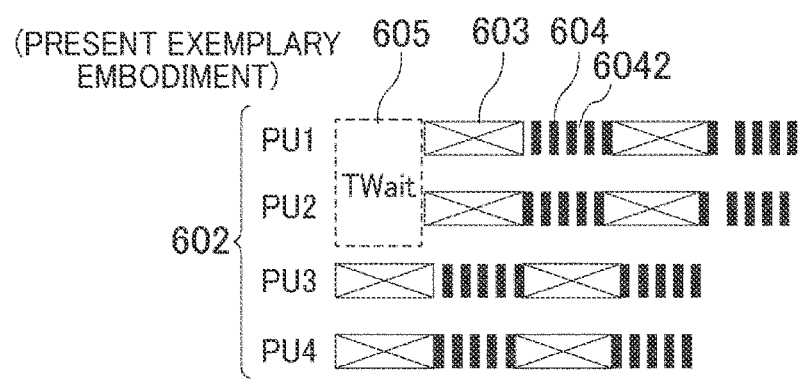
FIG. 6B is a time chart schematically illustrating a flow of operation of processing wafers in the vacuum processing apparatus pertaining to the present exemplary embodiment and depicted in FIG. 1.

Then, advantageous effects of the present invention are described with FIG. 6A and FIG. 6B. Marked with a reference numeral 601 in FIG. 6A is a time chart schematically illustrating a flow of operation of processing wafers over time according to prior art. Marked with a reference numeral 602 in FIG. 6B is a time chart schematically illustrating a flow of operation of processing wafers over time in the vacuum processing apparatus 101 pertaining to the present exemplary embodiment.

In FIG. 6A and FIG. 6B, a reference numeral 603 denotes a time it takes to perform cleaning of a vacuum processing chamber, a reference numeral 604 denotes a time it takes to process a product in a processing chamber, a reference numeral 6041 denotes an idling time for which a vacuum processing chamber waits for completion of transfer of a next wafer according to prior art, a reference numeral 6042 denotes an idling time for which a vacuum processing chamber waits for completion of transfer of a next wafer according to the present exemplary embodiment. Both are compared by way of these charts in which the sequences of time slots corresponding to the above-mentioned times are illustrated with their width made differ in a lateral direction (along the time axis) in each chart. Both the prior art and the present exemplary embodiment use PU1, PU2, PU3, and PU4.

The time chart 62 of FIG. 6B pertaining to the present exemplary embodiment illustrates a case where a decision is made that it is possible to start processing earlier at the step S502 and a processing sequence is determined to start processing earlier in PU3 and PU4 at the step S403 in the present exemplary embodiment.

Twait 605 in FIG. 6B is a time for which a set of vacuum processing chambers PU1 and PU2 waits for processing. Cleaning 603 of each vacuum processing chamber is a cleaning process without using wafers which is performed before the start of product processing and after every five product wafers are processed and this process time is the same length of time.

Product processing 604 in each vacuum processing chamber is processing one wafer product and its processing time is the same length of time for both the time chart 601 of the prior art and the time chart 602 pertaining to the present exemplary embodiment. Between one product processing 604 and next product processing 604, a time for which the vacuum processing chamber waits for completion of transfer of a next wafer, namely, an idle time 6041 or an idle time 6042 occurs. Comparison between the idle time 6041 in the time chart 601 of FIG. 6A and the idle time 6042 in the time chart 602 of FIG. 6B tells that the idle time 6042 in FIG. 6B is shorter; in other words, this indicates a higher throughput.

Figure 7A:
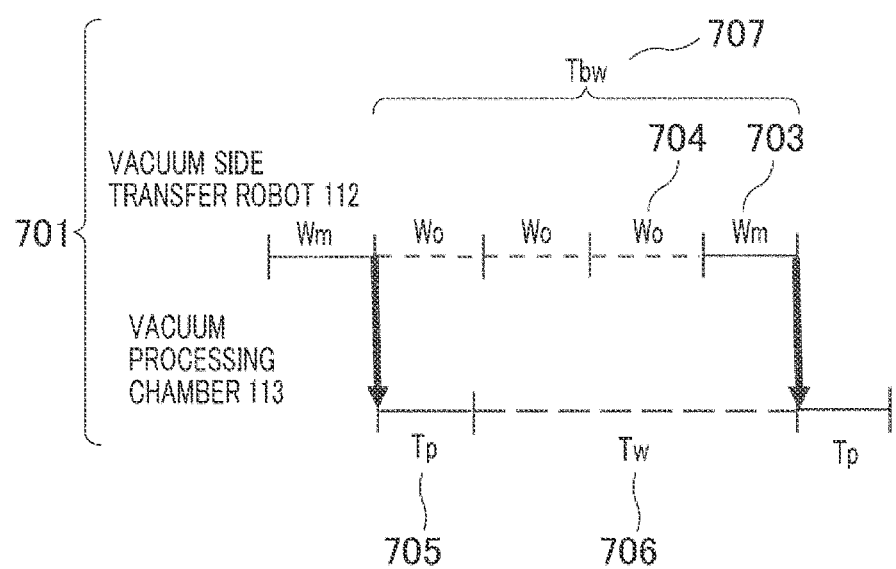
FIG. 7A is a time chart of a vacuum side transfer robot and a vacuum processing chamber in a case where four vacuum processing chambers are used simultaneously in the vacuum processing apparatus pertaining to the present exemplary embodiment and depicted in FIG. 1.
Figure 7B:
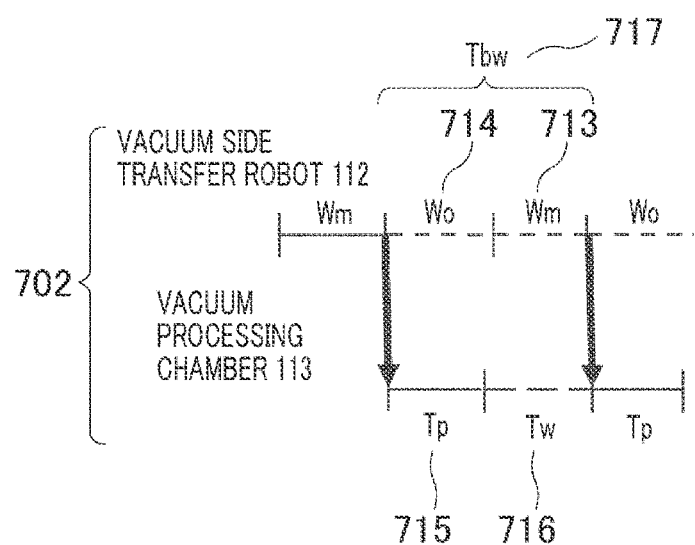
FIG. 7B is a time chart of a vacuum side transfer robot and a vacuum processing chamber in a case where two vacuum processing chambers are used simultaneously in the vacuum processing apparatus pertaining to the present exemplary embodiment and depicted in FIG. 1.

Then, using FIG. 7A and FIG. 7B, a description is provided about difference in the number of vacuum processing chambers that the vacuum processing apparatus 101 uses simultaneously, namely, about the idle times 6041 and 6042 of each vacuum processing chamber in the time charts 601 and 602 of FIG. 6A and FIG. 6B. FIG. 7A and FIG. 7B are intended to compare the time charts of a vacuum side transfer robot 112 and a vacuum processing chamber 113, respectively, in terms of difference in the number of vacuum processing chambers that the vacuum processing apparatus 101 uses simultaneously. Here, it is assumed that a bottleneck portion of the vacuum processing apparatus is the vacuum side transfer robot 112.

Consideration is made for a case of transferring wafers to four vacuum processing chambers 113, 114, 118, and 119 using the time chart 701 of FIG. 7A and, likewise, a case of transferring wafers to two vacuum processing chambers 113 and 114 using the time chart 702 of FIG. 7B.

Wm 703 in FIG. 7A and Wm 713 in FIG. 7B are a time for which the vacuum side transfer robot 112 is transferring a wafer to the relevant processing chamber, i.e., the vacuum processing chamber 113 (this transfer is performed in the steps S210 and S211). Then, Wo 704 in FIG. 7A and Wo 714 in FIG. 7B are a time for which the vacuum side transfer robot 112 is transferring a wafer to a place other than the relevant processing chamber (this transfer is performed in the steps S210 and S211). A place other than the relevant processing chamber is the vacuum processing chamber 114 or the standby space 115 for the time chart 701 of FIG. 7A; it is the vacuum processing chamber 114 for the time chart 702 of FIG. 7B.

Tp 705 in FIG. 7A and Tp 715 in FIG. 7B are a time for which a produce is processed in the vacuum processing chamber 113 (this is performed in the step S212). All TPs 705 in FIG. 7A and 715 in FIG. 7B are the same length of time.

Tw 706 in FIG. 7A and Tw 716 in FIG. 7B are an idle time after processing of a product wafer is done in the vacuum processing chamber 113 until completion of transfer of a next product wafer thereto.

Here, the time Tw 716 in the time chart 702 of FIG. 7B is shorter than the time Tw 706 in the time chart 701 of FIG. 7A. In the time chart 701 of the FIG. 7A, there is a time for which the vacuum side transfer robot 112 are transferring three other wafers until a wafer has been transferred to the vacuum processing chamber 113. On the other hand, in the time chart of FIG. 7B, there is only a time for which the vacuum side transfer robot 112 is transferring only another wafer until a wafer has been transferred to the vacuum processing chamber 113. In other words, a decrease in the number of vacuum processing chambers that are used simultaneously in the vacuum processing apparatus 101 makes Tw 716 shorter.

According to the foregoing exemplary embodiment, in the vacuum processing apparatus with interlinked chambers in which multiple transfer units having a transfer robot inside a transfer chamber within a container are interlinked and at least one processing unit for processing workpieces inside a processing chamber within a vacuum container is connected with each transfer unit, processing is scheduled to start earlier, thereby creating a state where one set of processing units is under a cleaning process, whereas another set of processing units is engaged in processing wafers intended for products. Transferring workpieces to only processing chambers included within a set can lead to a decrease in the time for which a processing chamber waits for a workpiece and makes it possible to perform earlier processing of products as many as the number of wafers that can be handled in a cleaning period than in prior art. Note that, for a set not scheduled to start processing earlier, a processing sequence is set so that the set will wait for a period corresponding to a product processing time defined in terms of a periodic number of wafers, calculated from an operating time taken for a transfer operation which is regarded as a bottleneck, and then start processing.

Consequently, in a case where the time it takes to process wafers in a processing unit is sufficiently longer than the cleaning process time and supposing that the vacuum processing apparatus is operated to produce products in large quantities through continuous processing of a batch of wafers, e.g., one lot of wafers, a preconfigured sequence in which to transfer and process each wafer in the lot makes reduction in the wait time for wafer transfer and eliminates a decrease in throughput even in a state where one processing unit in the vacuum processing apparatus is under a cleaning process, whereas another processing unit is engaged in the process of processing wafers intended for products.

In summary, according to the forgoing exemplary embodiment, parallel and efficient execution of a process of cleaning one processing unit and workpiece processing in another processing unit is feasible, thereby eliminating a decrease in processing efficiency or throughput of the vacuum processing apparatus.

While the invention made by the present inventors has been described specifically based on the exemplary embodiment, the present invention is not limited to the foregoing exemplary embodiment and it will be appreciated that various modifications may be made thereto without departing from the gist of the invention. By way of example, the foregoing exemplary embodiment has been described in detail to explain the present invention clearly and the invention is not necessarily limited to those including all components described. Besides, for a subset of the components of the exemplary embodiment, other components may be added to the subset or the subset may be removed or replaced by other components.

LIST OF REFERENCE SIGNS

101: vacuum processing apparatus,
102: atmospheric side block,
103: vacuum side block,
104: control unit,
105: load port,
106: atmospheric transfer container,
107: atmospheric side transfer robot,
108: aligner,
109: waiting station,
110: load lock chamber,
111, 116: vacuum transfer chamber,
112, 117: vacuum side transfer robot,
113, 114, 118, 119: vacuum processing chamber,
115: standby space,
120: computing unit,
121: storage unit,
122: transfer schedule processing unit,
123: transfer control processing unit,
124: apparatus status information,
125: processing chamber information,
126: processing instruction information,
127: processing progress information,
128: wafer transfer sequence information,
129: information on limited number of transferable wafers,
130: apparatus THP information,
131: network,
132: host

The invention claimed is:

1. An operating method of a vacuum processing apparatus for processing multiple wafers sequentially in a vacuum processing apparatus comprising multiple vacuum transfer containers arranged in a front-to-back direction, any adjacent two of which are interlinked and have an inside space which defines a transfer chamber in which a transfer robot for transferring a wafer to be processed is deployed, a lock chamber inside which a wafer is housed, placed in front of and connected with a vacuum transfer container of the multiple transfer containers which is located most forward, and multiple processing units each of which is connected with each of the multiple transfer containers respectively and includes a vacuum processing container in which a wafer is processed, wherein each of the multiple processing units is subjected to a process of cleaning the interior thereof upon elapse of a predetermined period, the operating method comprising:

in advance of processing multiple wafers, configuring multiple sets of processing units to process each of the wafers from among the multiple processing units and starting processing of the wafers, delayed by a predetermined time in descending order of the number of processing units included in each of the multiple sets of processing units and in descending order of distance of the processing units included from the lock chamber.

2. The operating method of a vacuum processing apparatus according to claim 1, wherein, for the processing units, a time taken for the cleaning process is larger than a time taken for processing the wafers.

3. The operating method of a vacuum processing apparatus according to claim 1, wherein each of the multiple processing units is subjected to the process of cleaning the interior thereof after the number of wafers processed therein has reached a predetermined value.

4. The operating method of a vacuum processing apparatus according to claim 3, wherein each of the multiple wafers is processed under the same conditions including a time taken for processing in each of the multiple processing units, and wherein, if an interval of carrying a wafer into each processing unit belonging to each of the sets of processing units is larger than the time taken for processing, the operating method starts processing of the wafers, delayed by the predetermined period that is a value of a product of the interval and the time taken for processing.

5. The operating method of a vacuum processing apparatus according to claim 1, wherein the operating method starts processing of the wafers, delayed by the predetermined period which is calculated according to a portion among each of the multiple sets of processing units where the operation of transferring the wafers therein is regarded as a bottleneck in transferring the wafer in each of the multiple sets of processing units, the portion being identified with respect to each of the sets of processing units.

6. The operating method of a vacuum processing apparatus according to claim 1, wherein, for the sets of processing units, each set consists of processing units connected with one of the multiple vacuum transfer containers.

* * * * *